(12) United States Patent
Cram et al.

(10) Patent No.: US 11,177,619 B2
(45) Date of Patent: Nov. 16, 2021

(54) TECHNIQUES FOR HIGH-SPEED COMMUNICATIONS THROUGH SLIP RINGS USING MODULATION AND MULTIPATH SIGNALING

(71) Applicant: Raytheon Company, Waltham, MA (US)

(72) Inventors: William L. Cram, Wolfe City, TX (US); Alan G. Stuessy, McKinney, TX (US)

(73) Assignee: Raytheon Company, Waltham, MA (US)

( * ) Notice: Subject to any disclaimer, the term of this patent is extended or adjusted under 35 U.S.C. 154(b) by 212 days.

(21) Appl. No.: 16/661,851

(22) Filed: Oct. 23, 2019

(65) Prior Publication Data

US 2021/0126414 A1  Apr. 29, 2021

(51) Int. Cl.
| | | |
|---|---|---|
| *H01R 39/10* | (2006.01) | |
| *H01R 39/34* | (2006.01) | |
| *H04B 1/711* | (2011.01) | |
| *H03M 13/11* | (2006.01) | |
| *H02K 13/00* | (2006.01) | |
| *H04L 5/00* | (2006.01) | |
| *H04B 7/212* | (2006.01) | |
| *H02K 13/02* | (2006.01) | |

(52) U.S. Cl.
CPC ............ *H01R 39/10* (2013.01); *H01R 39/34* (2013.01); *H02K 13/003* (2013.01); *H02K 13/02* (2013.01); *H03M 13/1102* (2013.01); *H04B 1/711* (2013.01); *H04B 7/212* (2013.01); *H04L 5/0007* (2013.01)

(58) Field of Classification Search
CPC ....... H01R 39/08; H01R 39/34; H04B 5/0025
See application file for complete search history.

(56) References Cited

U.S. PATENT DOCUMENTS

| | | | |
|---|---|---|---|
| 6,956,445 B2 | 10/2005 | Coleman | |
| 7,913,773 B2 | 3/2011 | Li et al. | |
| 10,069,667 B1 | 9/2018 | Bench et al. | |
| 10,756,926 B2 * | 8/2020 | Habermehl | ............. H04L 12/10 |

(Continued)

OTHER PUBLICATIONS

Wikipedia, "G.hn", Sep. 2019, 12 pages.

(Continued)

*Primary Examiner* — Kevin Kim

(57) ABSTRACT

A transmitter is configured to generate a signal carrying data. A signal splitter is configured to generate multiple copies of the signal. A slip ring includes first and second portions, one configured to rotate relative to the other. The slip ring also includes a first interface associated with the first portion and configured to receive the multiple copies of the signal. The slip ring further includes a second interface associated with the second portion. In addition, the slip ring includes multiple electrical pathways electrically coupling the first and second interfaces, where at least some of the electrical pathways are configured to transport the multiple copies of the signal from the first interface to the second interface. A signal combiner is configured to receive the multiple copies of the signal from the second interface and to generate a recovered signal. A receiver is configured to recover the data from the recovered signal.

20 Claims, 7 Drawing Sheets

(56) References Cited

U.S. PATENT DOCUMENTS

| | | | |
|---|---|---|---|
| 2013/0034196 A1* | 2/2013 | Vann | H04B 7/002 |
| | | | 375/350 |
| 2015/0111508 A1* | 4/2015 | Hansen | H01Q 21/28 |
| | | | 455/73 |
| 2016/0359707 A1 | 12/2016 | Martin et al. | |
| 2017/0019847 A1* | 1/2017 | Han | H04W 36/0066 |
| 2018/0048395 A1* | 2/2018 | Brinker | H04B 10/80 |
| 2020/0119948 A1* | 4/2020 | Habermehl | H04L 12/40045 |

OTHER PUBLICATIONS

Maxlinear, Inc., "Wave-2 Powerline Networking Evaluation, Public User Guide", 2018, 30 pages.
Maxlinear, Inc., "G.hn Wave-2 Networking Products", May 2019, 4 pages.
Wikipedia, "Slip ring", Sep. 2019, 4 pages.

\* cited by examiner

TECHNIQUES FOR HIGH-SPEED COMMUNICATIONS THROUGH SLIP RINGS USING MODULATION AND MULTIPATH SIGNALING

TECHNICAL FIELD

This disclosure relates generally to communication systems. More specifically, this disclosure relates to techniques for high-speed communications through slip rings using modulation and multipath signaling.

BACKGROUND

Slip rings are devices that generally allow for the transmission of data, power, or other signals between multiple structures, where at least one of the structures is rotatable with respect to the other. For example, various systems use slip rings to support data communications to and from rotating objects and to provide power to the rotating objects. As a particular example, various types of vehicles (such as land, airborne, space, and underwater vehicles) often have cameras, sensors, or other components that are mounted on and rotated by multi-axis or other rotating gimbals. Often times, these gimbals allow for 360° rotation of the components, allowing the components to be rotated and pointed in desired directions. Slip rings can be used in these types of systems to provide power from the vehicles to the components on the gimbals and to transport electrical signals containing data between the vehicles and the components on the gimbals. Unfortunately, slip rings are noisy and lossy devices, meaning they can create significant interference, attenuation, or other noises or losses in signals being transmitted through the slip rings.

SUMMARY

This disclosure provides techniques for high-speed communications through slip rings using modulation and multipath signaling.

In a first embodiment, a system includes a transmitter configured to generate a signal carrying data, a signal splitter configured to generate multiple copies of the signal, and a slip ring. The slip ring includes a first portion and a second portion, where one portion of the slip ring is configured to rotate relative to the other portion of the slip ring. The slip ring also includes a first interface associated with the first portion of the slip ring and configured to receive the multiple copies of the signal. The slip ring further includes a second interface associated with the second portion of the slip ring. In addition, the slip ring includes multiple electrical pathways electrically coupling the first and second interfaces, where at least some of the electrical pathways are configured to transport the multiple copies of the signal from the first interface to the second interface. The system also includes a signal combiner configured to receive the multiple copies of the signal from the second interface and to generate a recovered signal using the multiple copies of the signal. The system further includes a receiver configured to recover the data from the recovered signal.

In a second embodiment, an apparatus includes a transmitter configured to generate a signal carrying data, a signal splitter configured to generate multiple copies of the signal, and a slip ring. The slip ring includes a first portion and a second portion, where one portion of the slip ring is configured to rotate relative to the other portion of the slip ring. The slip ring also includes a first interface associated with the first portion of the slip ring and configured to receive the multiple copies of the signal. The slip ring further includes a second interface associated with the second portion of the slip ring. In addition, the slip ring includes multiple electrical pathways electrically coupling the first and second interfaces, where at least some of the electrical pathways are configured to transport the multiple copies of the signal from the first interface to the second interface.

In a third embodiment, an apparatus includes a slip ring. The slip ring includes a first portion and a second portion, where one portion of the slip ring is configured to rotate relative to the other portion of the slip ring. The slip ring also includes a first interface associated with the first portion of the slip ring and configured to receive multiple copies of a signal carrying data. The slip ring further includes a second interface associated with the second portion of the slip ring. In addition, the slip ring includes multiple electrical pathways electrically coupling the first and second interfaces, where at least some of the electrical pathways are configured to transport the multiple copies of the signal from the first interface to the second interface. The apparatus also includes a signal combiner configured to receive the multiple copies of the signal from the second interface and to generate a recovered signal using the multiple copies of the signal. The apparatus further includes a receiver configured to recover the data from the recovered signal.

In other embodiments, methods corresponding the system of the first embodiment and the apparatuses of the second and third embodiments (or any of their dependent claims) are provided Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
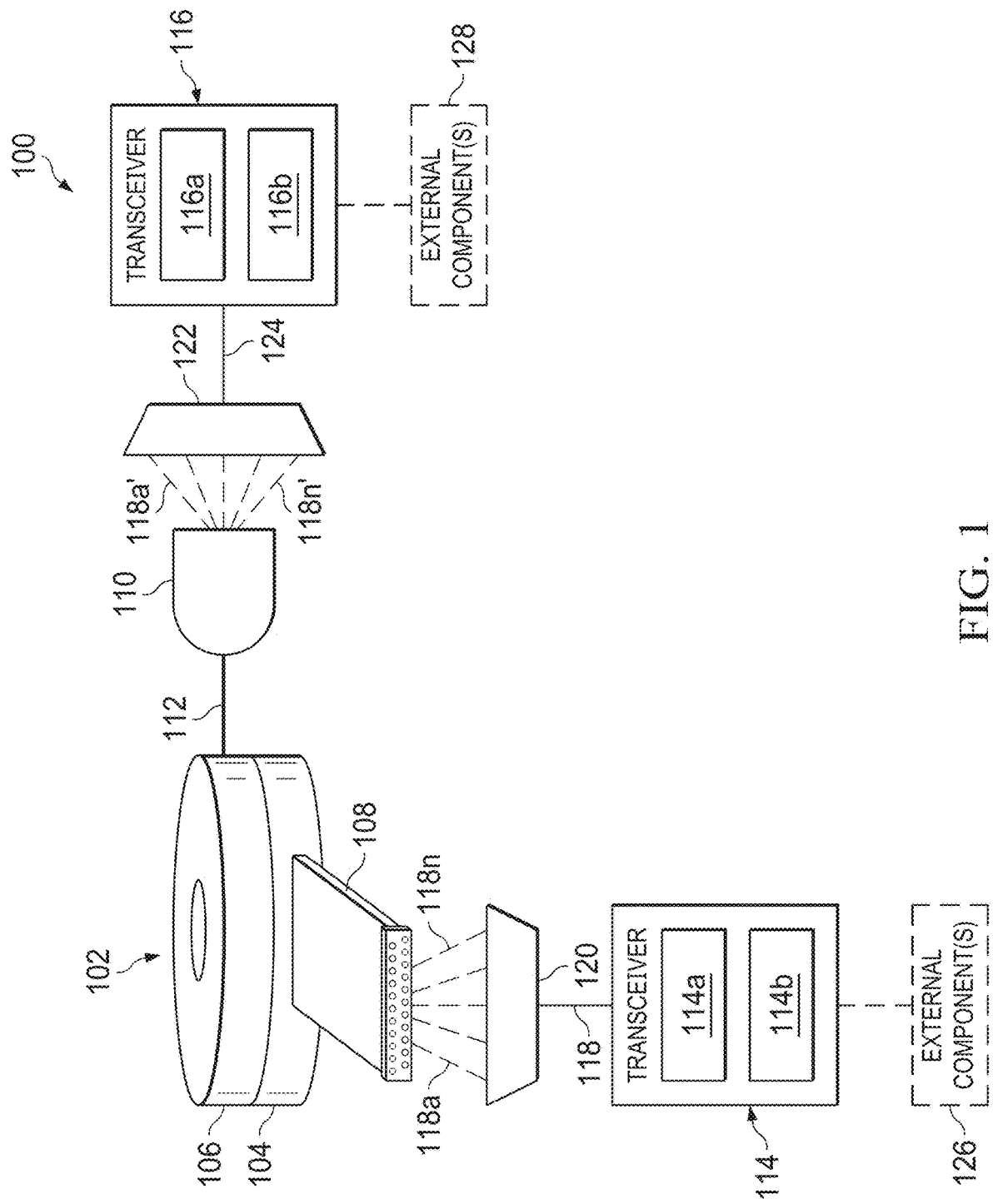
FIG. 1 illustrates an example system supporting high-speed communication through a slip ring using modulation and multipath signaling in accordance with this disclosure.

FIGS. 1 through 7, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, slip rings are often used to allow for the transmission of data, power, or other signals between multiple structures, where at least one of the structures is rotatable with respect to the other. One example use of slip rings is in vehicles (such as land, airborne, space, and underwater vehicles) that have cameras, sensors, or other components mounted on and rotated by gimbals. While slip rings can be used in these types of systems or other systems to support the transport of data, power, or other signals, slip rings are noisy and lossy devices. For example, since slip rings are mechanical devices, rotating part of a slip ring relative to another part of the slip ring may temporarily break an electrical pathway for a signal through the slip ring, resulting in a temporary signal loss. As another example, a motor or other actuator used to rotate part of a slip ring relative to another part of the slip ring may generate significant electrical interference or other noise. As a result, the use of slip rings can create significant noises and losses in signals being transmitted through the slip rings, making signal transport through the slip rings randomly unpredictable.

The presence of these noises and losses can severely impact the speed of data communications through a slip ring, which typically limits the use of slip rings to applications in which low-bandwidth signaling is used. Theoretically, in some cases a copper electrical connection through a slip ring can be used to achieve bandwidths of about 400 megabits per second (Mbps) to about 500 Mbps, but this is based on use in a laboratory environment or other ideal setting. In a typical real-world application where vibrations are common and thermal conditions are not strictly controlled, the bandwidth achieved using a copper electrical connection through a slip ring is significantly smaller, often on the order of about 90 Mbps to about 200 Mbps. This often limits the applications in which slip rings can be used.

One approach for increasing the bandwidth of communications through a slip ring has involved retrofitting or replacing a slip ring having electrical conductors with a fiber-optic slip ring. However, this approach has a number of shortcomings and disadvantages. Among other things, this approach is relatively expensive, requires quite a bit of space, and cannot be used in dirty environments where contaminants may interfere with the fiber optics. Also, fiber optics generally suffer from high link losses when optical fibers are bent by 90°, which is common in various applications involving slip rings. Further, this approach often requires the replacement of existing slip rings and the addition of new cabling, which further increases the cost and can require significant time to perform. In addition, these types of fiber optics are often not "radiation hardened," which limits or prevents their use in certain applications.

This disclosure describes various techniques for supporting high-speed communications through slip rings that involve the use of modulation and multipath signaling. As described in more detail below, multiple copies of a signal are generated and communicated using different electrical pathways through a slip ring. The use of multiple copies of the same signal sent over multiple pathways helps to ensure more consistent or uninterrupted transport of data through the slip ring. This is due to the fact that while each individual electrical pathway in a slip ring may be randomly unpredictable, it is far less likely that all of the electrical pathways in the slip ring will suffer significant noise or loss or otherwise be randomly unpredictable at the exact same time. This supports a multiple-input, multiple-output (MIMO) approach for communications through a slip ring.

In some embodiments, the electrical pathways used to transport the multiple copies of the signal through the slip ring can be spatially distributed within the slip ring, meaning the electrical pathways are not grouped together and are spread out spatially within the slip ring. This helps to significantly reduce the likelihood of all electrical pathways being interrupted at the exact same time. In particular embodiments, the electrical pathways through the slip ring used here represent electrical pathways for transporting power through the slip ring. Power electrical pathways are often thicker than data communication pathways, and power electrical pathways are often spatially distributed in a slip ring to ensure consistent power delivery through the slip ring (to combat vibration discontinuities). Also, there are often more power electrical pathways in a slip ring than data signal pathways, providing the ability to send multiple copies of the same signal over a large number of electrical pathways. Note, however, that specific embodiments may or may not involve spatial distribution and/or may or may not involve the use of power electrical pathways.

The use of multiple copies of the same signal sent over different communication pathways through a slip ring can create multipath interference issues or other distortion issues at a receiver. To help compensate for this, a suitable modulation scheme is used with the multiple copies of the signal, such as Orthogonal Frequency Division Multiplexing (OFDM) or other modulation techniques that are effective at recovering signals affected by signal distortions. Of course, any other suitable modulation scheme can be used here. The use of a modulation scheme like OFDM can help to combat multipath interference or other issues associated with the receipt of the same copy of a transmitted signal over multiple communication pathways. Also, the modulated or encoded signals can be transmitted through the slip ring using a suitable channel access technique, such as Time Division Multiple Access (TDMA) or Code Division Multiple Access (CDMA). In addition, suitable error correction can be supported by a transmitter and a receiver communicating through a slip ring, such as a low-density parity-check (LDPC) forward error correction (FEC) code or other suitable error correcting code. As a particular example, the signals communicated through a slip ring may be encoded using the International Telecommunication Union-Telecommunications (ITU-T) G.hn standard, which includes the ITU-T G.9960 and G.9961 specifications.

In this way, multiple copies of a signal carrying data can be sent through multiple electrical pathways of a slip ring, helping to ensure more reliable receipt of at least one of the copies of the signal carrying the data at a receiver. Moreover, the modulation scheme used with the multiple copies of the signal carrying the data through the slip ring helps to combat multipath issues and other issues associated with the transmission of multiple copies of the same signal, helping to ensure more reliable recovery of the data at the receiver.

Among other things, these features help to achieve improved communication bandwidths through a slip ring. In some embodiments, data can be communicated through a slip ring at a rate of up to about 1 gigabits per second (Gbps), about 1.5 Gbps, about 2.0 Gbps, about 2.5 Gbps, or even higher. This enables the use of Gigabit Ethernet or other gigabit-level communications through a slip ring, which allows the use of the slip ring in high-bandwidth applications like those involving high-definition (HD) uncompressed video or Serial Front Panel Data Port (SFPDP) streaming. Not only that, the approaches described in this patent document can often be implemented by supplementing or replacing circuit boards that plug into or that are used with slip rings, rather than by replacing the slip rings and their associated cabling or signal traces. This allows for much easier and cheaper retrofitting of existing systems that use slip rings, as well as easy incorporation of this functionality into new systems. Various additional features of the disclosed techniques are provided below.

FIG. 1 illustrates an example system 100 supporting high-speed communication through a slip ring using modulation and multipath signaling in accordance with this disclosure. As shown in FIG. 1, the system 100 includes a slip ring 102, which generally includes a first portion 104 and a second portion 106. The first portion 104 of the slip ring 102 is rotatable relative to the second portion 106 of the slip ring 102. Various structures for slip rings are known in the art and can be used here to allow rotation of the first portion 104 of the slip ring 102 relative to the second portion 106 of the slip ring 102. For instance, part of the first portion 104 of the slip ring 102 may extend into an interior of the second portion 106 of the slip ring 102 and can be retained within (but still be rotatable with respect to) the second portion 106 of the slip ring 102. In some embodiments, the first portion 104 of the slip ring 102 can be coupled to one or more rotatable objects, and the second portion 106 of the slip ring 102 can be coupled to a support structure or otherwise retained in a fixed position. These embodiments can therefore allow for rotation of the rotatable object(s) relative to the support structure. Note, however, that the slip ring 102 may be used in any other suitable manner.

In this particular example, the slip ring 102 has a generally cylindrical shape, and each portion 104 and 106 of the slip ring 102 has a generally cylindrical shape forming part of the overall shape of the slip ring 102. However, these shapes are for illustration only, and each portion 104 and 106 of the slip ring 102 and the slip ring 102 itself can have any other suitable size, shape, and dimensions. Also, in this particular example, the first portion 104 of the slip ring 102 and the second portion 106 of the slip ring 102 are generally equal in size and shape to each other. However, the different portions 104 and 106 of the slip ring 102 may have different sizes, shapes, or dimensions as needed or desired. As a particular example, in some embodiments, the first portion 104 of the slip ring 102 may be designed to include one or more structures configured to be coupled to a specific rotatable device or other object. As another particular example, in some embodiments, the second portion 106 of the slip ring 102 may be designed to include one or more integrated flanges that allow the second portion 106 of the slip ring 102 to be coupled to a support structure.

As described in more detail below, the first portion 104 of the slip ring 102 may include one or more rotating discs or other rotating structures that include electrically-conductive traces, and the second portion 106 of the slip ring 102 may include electrical contacts (also called brushes) that rub against or otherwise contact the electrically-conductive traces. This allows the transport of data, power, or other signals through the brushes and the electrically-conductive traces, thereby allowing the signals to be exchanged between the different portions 104 and 106 of the slip ring 102 and to pass through the slip ring 102. Note, however, that there are numerous ways in which the slip ring 102 can be designed to allow for data, power, or other signals to be transported between the different portions 104 and 106 of the slip ring 102 and through the slip ring 102. For instance, the second portion 106 of the slip ring 102 may include the one or more rotating discs or other rotating structures with the electrically-conductive traces, and the first portion 104 of the slip ring 102 may include the brushes. This disclosure is not limited to any specific implementation of the slip ring 102.

The slip ring 102 also includes a first interface 108 and a second interface 110. The interfaces 108 and 110 are configured to support the communication of data, power, or other signals through the slip ring 102. For example, the first interface 108 may include electrical connections to electrically pathways that communicatively couple the first interface 108 to the electrically-conductive traces on the one or more rotating discs or other rotating structures of the first portion 104 of the slip ring 102. The first interface 108 is also configured to be communicatively coupled to one or more first external components 126 that wish to transmit or receive data, power, or other electrical signals through the slip ring 102. Similarly, the second interface 110 may include connections to electrically pathways that communicatively couple the second interface 110 to the brushes of the second portion 106 of the slip ring 102. The second interface 110 is also configured to be communicatively coupled to one or more second external components 128 that wish to transmit or receive data, power, or other electrical signals through the slip ring 102. As noted above, the locations of the brushes and electrically-conductive traces can be reversed in the slip ring 102, in which case the first interface 108 may be electrically coupled to the brushes and the second interface 110 may be electrically coupled to the traces.

In some embodiments, the interfaces 108 and 110 can be used to transport data and power through the slip ring 102, and the data and power flows can be uni-directional or bi-directional as needed or desired. For example, the first interface 108 may receive data being transmitted from one or more first external components 126 and provide the data through the slip ring 102 to the second interface 110. The data flow can also be reversed to send data from the second interface 110 to the first interface 108 through the slip ring 102. As another example, the second interface 110 may receive electrical power being provided by one or more second external components 128 and provide the electrical power through the slip ring 102 to the interface 108. The power flow can also be reversed to send power from the first interface 108 to the second interface 110 through the slip ring 102.

Each interface 108 and 110 includes any suitable structure configured to transmit electrical signals through and/or receive electrical signals from a slip ring 102. In this particular example, the first interface 108 represents an elongated structure that is coupled to the first portion 104 of the slip ring 102 and that has a number of connection points arranged in several rows. Also, in this particular example, the second interface 110 represents a circular structure that is connected to the second portion 106 of the slip ring 102 using at least one cable 112. Note, however, that both forms of the interfaces 108 and 110 here are for illustration only. Each interface 108 and 110 may have any suitable size, shape, and dimensions. Also, each interface 108 and 110 may be physically or electrically coupled to the corresponding portion 104 and 106 of the slip ring 102 in any suitable manner. In addition, each interface 108 and 110 may include or support any suitable number of electrical connections through the slip ring 102. Each cable 112 includes any suitable structure having one or more conductive pathways configured to transport one or more electrical signals.

As described above, the slip ring 102 tends to be a very noisy and lossy device. In order to support high-speed communications, more reliable communications, or other communications through the slip ring 102, the system 100 includes transceivers 114 and 116 that support various mechanisms for communicating through the slip ring 102. In this example, the transceiver 114 generally includes or supports a transmitter 114a configured to transmit data through the slip ring 102 and a receiver 114b configured to recover data received through the slip ring 102. Similarly, the transceiver 116 generally includes or supports a transmitter 116a configured to transmit data through the slip ring 102 and a receiver 116b configured to recover data received through the slip ring 102.

In the following discussion, it may be assumed that the transceiver 114 is using the transmitter 114a and the transceiver 116 is using the receiver 116b so that data can be communicated upward through the slip ring 102 in FIG. 1. However, the same or similar process can be used to support the communication of data downward through the slip ring 102 in FIG. 1 using the transmitter 116a and the receiver 114b. Moreover, while two transceivers 114 and 116 are shown here as supporting bi-directional communication through the slip ring 102, uni-directional communication through the slip ring 102 may also be needed or desired in certain embodiments. In those embodiments, the transceiver 114 can be replaced by a transmitter only, and the transceiver 116 can be replaced by a receiver only (or vice versa).

Assuming communication is occurring in which data flows upward through the slip ring 102, the transceiver 114 generates a modulated data signal 118. The modulated data signal 118 contains data being transmitted through the slip ring 102. The data signal 118 is encoded or otherwise modulated using a suitable modulation scheme. Various modulation schemes can be used here, such as OFDM or other modulation techniques that are effective at allowing the recovery of signals in the presence of signal distortions. Also, the modulated data signal 118 can be transmitted from the transceiver 114 towards the slip ring 102 using a suitable channel access technique, such as TDMA or CDMA. In addition, the transceivers 114 and 116 may support any suitable error correction when communicating data through the slip ring 102, such as by using an LDPC FEC code or other suitable error correcting code to add error correction information into the data signal 118. As a particular example, the modulated data signal 118 may be communicated through the slip ring 102 by the transceivers 114 and 116 using the ITU-T G.hn standard (G.9960 and G.9961 specifications).

The modulated data signal 118 is provided to a signal splitter/combiner 120, which splits the modulated data signal 118 or otherwise generates multiple copies 118a-118n of the modulated data signal 118. The signal splitter/combiner 120 uses any suitable technique to generate the multiple copies 118a-118n of the modulated data signal 118. For example, the signal splitter/combiner 120 may split the modulated data signal 118 into multiple lower-power copies 118a-118n of the modulated data signal 118 and then (optionally) amplify the copies 118a-118n of the modulated data signal 118. Note, however, that this disclosure is not limited to any specific technique for generating multiple copies 118a-118n of the data signal 118.

The multiple copies 118a-118n of the modulated data signal 118 are provided to different inputs of the first interface 108, which allows the copies 118a-118n of the data signal 118 to be sent over different electrical paths through the slip ring 102 to the second interface 110. In some embodiments, the copies 118a-118n of the modulated data signal 118 are sent over spatially-distributed electrical pathways through the slip ring 102. Also, in some embodiments, the copies 118a-118n of the modulated data signal 118 are sent through electrical pathways designed to transport electrical power through the slip ring 102, and those electrical pathways may or may not be spatially distributed in the slip ring 102. Further, in some embodiments, the copies 118a-118n of the modulated data signal 118 may be superimposed over or ride on top of electrical power signals being sent over the electrical pathways through the slip ring 102. However, other embodiments may use any other suitable electrical pathways through the slip ring 102, regardless of whether those electrical pathways are spatially distributed and/or used to transport electrical power. Also, the data being sent through the slip ring 102 need not be superimposed over power signals.

After communication through the slip ring 102, received copies 118a'-118n' of the modulated data signal 118 are provided through the second interface 110 to a signal splitter/combiner 122, which combines the copies 118a'-118n' to produce a recovered modulated data signal 124. Ideally, the recovered modulated data signal 124 would exactly match the modulated data signal 118. However, in reality, the received copies 118a'-118n' of the signal 118 differ from the transmitted copies 118a-118n of the signal 118 due to interference, attenuation, or other noises or losses caused by the slip ring 102.

Note that the signal splitter/combiner 120 is described as splitting the signal 118 to produce the copies 118a-118n and that the signal splitter/combiner 122 is described as combining the copies 118a'-118n' to produce the signal 124. Once again, this is describing communication that occurs upward through the slip ring 102 in FIG. 1 from the transceiver 114 to the transceiver 116. For communication that occurs downward through the slip ring 102 in FIG. 1 from the transceiver 116 to the transceiver 114, the functions of the signal splitters/combiners 120 would be reversed. For that reason, each of these components 120 and 122 is described as representing a signal "splitter/combiner." However, if only one-way communication of data is desired through the slip ring 102, the signal splitter/combiner 120 may be said to represent a signal splitter, and the signal splitter/combiner 122 may be said to represent a signal combiner (or vice versa). Also, depending on the implementation, the signal splitter/combiner 120 may be separated into distinct signal splitter and signal combiner units, and the signal splitter/combiner 122 may be separated into distinct signal splitter and signal combiner units.

The recovered modulated data signal 124 is provided to the transceiver 116, which processes the recovered modulated data signal 124 to extract data from the data signal 124. For example, the transceiver 116 can perform OFDM demodulation or other demodulation technique allowing signal recovery in the presence of distortions to demodulate the recovered modulated data signal 124. This can also help to combat multipath interference issues associated with receiving the copies 118a'-118b' of the signal 118 over multiple communication pathways. The transceiver 116 can also use TDMA, CDMA, or another channel access technique to receive the recovered modulated data signal 124. In addition, the transceiver 116 can use LDPC FEC information or other suitable error correcting code information in the recovered modulated data signal 124 to perform error correction and recover the original data being transmitted.

Each of the transceivers 114 and 116 can be coupled to any suitable external component or components 126 and 128, respectively. For example, the transceiver 114 can be coupled to one or more components 126 that rotate, such as one or more sensors, cameras, or other components on a rotatable gimbal. The transceiver 114 can provide data received through the slip ring 102 to the one or more components 126, and/or the transceiver 114 can transmit data received from the one or more components 126 through the slip ring 102. The one or more components 126 (and possibly the transceiver 114) can also be powered using electrical power received through the slip ring 102 and provided through the interface 108. Note that the power received by the one or more components 126 may be provided to the one or more components 126 directly from the interface 108 or indirectly, such as via the signal splitter/combiner 120 or the transceiver 114.

Similarly, the transceiver 116 can be coupled to one or more components 128, such as on a fixed platform. The transceiver 116 can provide data received through the slip ring 102 to the one or more components 128, and/or the transceiver 116 can transmit data received from the one or more components 128 through the slip ring 102. The one or more components 128 may also include at least one power supply used to provide electrical power to the one or more components 126 through the interfaces 108, 110 and the slip ring 102. As noted above, however, the direction of power flow through the slip ring 102 may also be reversed.

Each of the transceivers 114 and 116 includes any suitable structure configured to transmit and/or receive data. Each transmitter 114*a* and 116*a* includes any suitable structure configured to generate one or more signals for transmission, and each receiver 114*b* and 116*b* includes any suitable structure configured to receive and process one or more signals. In some embodiments, the transceivers 114 and 116 may be implemented using WAVE-2 devices from MAXLINEAR, INC., which support the ITU-T G.hn standard. As a particular example, the transceivers 114 and 116 may be implemented using DW920 gigabit Ethernet-to-powerline adapters and 88LX2720 analog front ends (AFEs) from MAXLINEAR, INC. Note, however, that each or both of the transceivers 114 and 116 may be implemented in any other suitable manner. Also note that each or both of the transceivers 114 and 116 may be implemented using a transmitter and a separate receiver.

Through the use of the transceivers 114 and 116 and the signal splitters/combiners 120 and 122, multiple copies of the same signal can carry data through multiple pathways of the slip ring 102. Also, the use of modulation by the transceivers 114 and 116 helps to combat multipath interference issues or other distortion issues that can arise when multiple copies of the same signal are transmitted over multiple non-identical paths. This allows the transceivers 114 and 116 to engage in high-data-rate or more-reliable MIMO communications through the slip ring 102. In some cases, the transceivers 114 and 116 can exchange data at a rate up to about 1 Gbps, about 1.5 Gbps, about 2.0 Gbps, about 2.5 Gbps, or more. These high data rates can be achieved at times when part of the slip ring 102 is rotating relative to the other part and at times when part of the slip ring 102 is not rotating relative to the other part.

Among other things, this type of bandwidth may allow HD uncompressed video, SFPDP, or other high-volume data to be streamed in real-time through the slip ring 102. In fact, these types of data rates may allow large amounts of HD video, SFPDP, or other data to be sent uncompressed through the slip ring 102, which can help to avoid delays and costs associated with compressing and decompressing the data. Of course, the data sent across the slip ring 102 may also be compressed if needed or desired. Also, this functionality can be easily retrofitted into existing systems, such as by replacing circuit boards so that suitable transceivers 114, 116 and signal splitters/combiners 120, 122 are available in the existing systems. This is often much easier and cheaper than trying to replace existing slip rings and their associated signal routing. This functionality can also be incorporated into new systems by including suitable transceivers 114, 116 and signal splitters/combiners 120, 122.

Note that the transmission media used to transport the copies 118*a*-118*n* of the signal 118 to the slip ring 102 and to transport the received copies 118*a*'-118*n*' of the signal 118 from the slip ring 102 can vary depending on the circumstances. For example, in some embodiments, the copies 118*a*-118*n* and received copies 118*a*'-118*n*' of the signal 118 may be transported over gigabit Ethernet connections, RS422 serial connections, or MIL-STD-1553 serial data connections. Of course, any other suitable transmission media can be used here.

Although FIG. 1 illustrates one example of a system 100 supporting high-speed communication through a slip ring 102 using modulation and multipath signaling, various changes may be made to FIG. 1. For example, the functionality described in this patent document for communicating over a slip ring 102 may be used in any other suitable system. Also, as noted above, the communication over a slip ring 102 may be uni-directional or bi-directional, which can impact which components in FIG. 1 are or are not used in the system 100. In addition, various components shown in FIG. 1 may be combined, further subdivided, rearranged, or omitted according to particular needs. As a specific example, the signal splitters/combiners 120 and 122 may form part of the transceivers 114 and 116, respectively.

Figure 2:
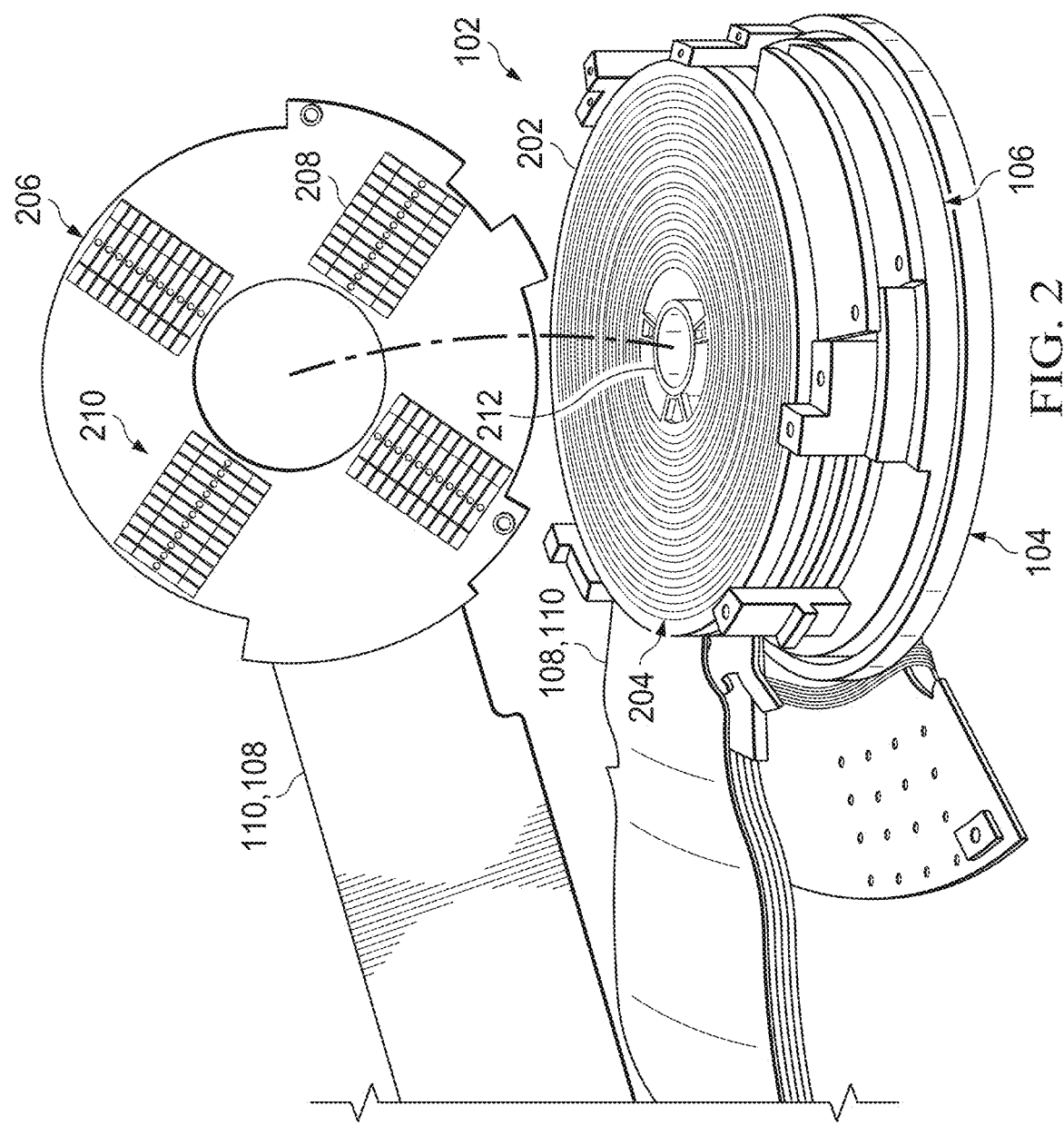
FIG. 2 illustrates an example slip ring for use in a system supporting high-speed communication using modulation and multipath signaling in accordance with this disclosure.

FIG. 2 illustrates an example slip ring 102 for use in a system supporting high-speed communication using modulation and multipath signaling in accordance with this disclosure. For ease of explanation, the slip ring 102 of FIG. 2 is described as being used in the system 100 of FIG. 1. However, the slip ring 102 may be used in any other suitable system. Also, other implementations of the slip ring 102 may be used in the system 100 of FIG. 1 or other suitable system.

As shown in FIG. 2, the slip ring 102 includes a substrate 202 containing or carrying multiple electrically-conductive traces 204. The substrate 202 is typically formed using a printed circuit board or other dielectric material, and the electrically-conductive traces 204 are typically formed on the substrate 202 using one or more metals or other conductive material(s). While not shown here, the electrically-conductive traces 204 are electrically coupled to one of the interfaces 108, 110, which is often accomplished using conductive vias formed through the substrate 202 and electrical traces on the back side of the substrate 202. In this example, the substrate 202 has the form of an annular disc, although the substrate 202 can have any other suitable size, shape, and dimensions.

The slip ring 102 also includes another substrate 206 containing or carrying multiple electrically-conductive brushes 208. The substrate 206 is typically formed using a printed circuit board or other dielectric material, and the electrically-conductive brushes 208 are typically connected to the substrate 206 and are formed using one or more metals or other conductive material(s). In this example, the electrically-conductive brushes 208 represent raised arms or other raised structures that can contact and slide along the electrically-conductive traces 204. While not shown here, the electrically-conductive brushes 208 are electrically coupled to another of the interfaces 110, 108, which is often accomplished using conductive vias formed through the substrate 206 and electrical traces on the back side of the substrate 206. In this example, the substrate 206 has the form of an annular disc with notches along its outer perimeter, although the substrate 206 can have any other suitable size, shape, and dimensions.

As shown here, there are multiple groups 210 of electrically-conductive brushes 208 positioned around a central opening of the substrate 206. For each electrically-conductive trace 204, there may be one brush 208 or one set of brushes 208 in each group 210 that can slide along that electrically-conductive trace 204, thereby providing multiple redundant pathways for each signal traveling through the slip ring 102. This type of redundancy can help to ensure that a signal is transmitted to or received from each electrically-conductive trace 204, since it is less likely that multiple brushes 208 sliding along the same electrically-conductive trace 204 would all simultaneously lose electrical connection to the electrically-conductive trace 204. Note, however, that multiple groups 210 of brushes 208 may not be required, and a single group 210 of brushes 208 may be used.

As can be seen in FIG. 2, the electrically-conductive traces 204 represent annular electrical paths that extend completely around a central axis of the substrate 202. This allows the electrically-conductive traces 204 to be used to transport data, power, or other electrical signals regardless of the rotational orientation of the different portions 104 and 106 of the slip ring 102.

As noted above, the substrate 202 in FIG. 2 has the form of an annular disc, and the substrate 206 in FIG. 2 has the form of an annular disc with a notched outer perimeter. In this particular implementation, the substrate 206 may be fixed within the slip ring 102 and may not be rotatable, while the substrate 202 may rotate around a central axis of the slip ring 102. This allows one part of the slip ring 102 to rotate relative to the other part of the slip ring 102. Here, the substrate 202 is attached to a central axle 212 running through the center of the slip ring 102. The central axle 212 may be coupled to or form a part of the first portion 104 of the slip ring 102 and extend upward through the second portion 106 of the slip ring 102. This allows rotation of the first portion 104 of the slip ring 102 to translate into rotation of the substrate 202 and its associated traces 204 around the central axle 212. Note, however, that other slip rings 102 can be used that have other designs.

As noted above, a spatial distribution of electrical pathways can be used to transport the multiple copies 118a-118n of the signal 118 through the slip ring 102. In some embodiments, this spatial distribution can be achieved by transporting the copies 118a-118n of the signal 118 through different non-adjacent electrically-conductive traces 204 and through different non-adjacent electrically-conductive brushes 208. The non-adjacent electrically-conductive traces 204 and the non-adjacent electrically-conductive brushes 208 may be evenly or non-evenly separated within the slip ring 102. As a particular example, the copies 118a-118n of the signal 118 can be transported through four, five, or some other number of non-adjacent electrically-conductive traces 204 and four, five, or some other number of non-adjacent electrically-conductive brushes 208.

In some embodiments, there can be multiple pairs of substrates 202, 206 that are stacked into multiple levels of the slip ring 102. When multiple pairs of substrates 202, 206 are provided, their associated traces 204 and brushes 208 can be used to transport a larger number of data, power, or other signals through the slip ring 102. In these embodiments, spatial distribution of the multiple copies 118a-118n of the signal 118 can be at least partially achieved by transporting different copies 118a-118n of the signal 118 through different levels of the slip ring 102. Note that in other embodiments, however, a single pair of substrates 202, 206 and their associated traces 204 and brushes 208 can be used can be used in the slip ring 102.

Although FIG. 2 illustrates one example of a slip ring 102 for use in a system supporting high-speed communication using modulation and multipath signaling, various changes may be made to FIG. 2. For example, other types of slip ring designs are known in the art and can be used here. As a particular example, this embodiment of the slip ring 102 has two generally planar substrates 202, 206 that are stacked together, which is often referred to as a "pancake" or "flat disc" slip ring design. Another type of slip ring design uses a cylinder with conductive traces extending around the outer curved side of the cylinder, and brushes extend from a housing around the cylinder and slide along the conductive traces. In general, any suitable slip ring design that supports the transport of multiple copies of a signal can be used here.

Figure 3:
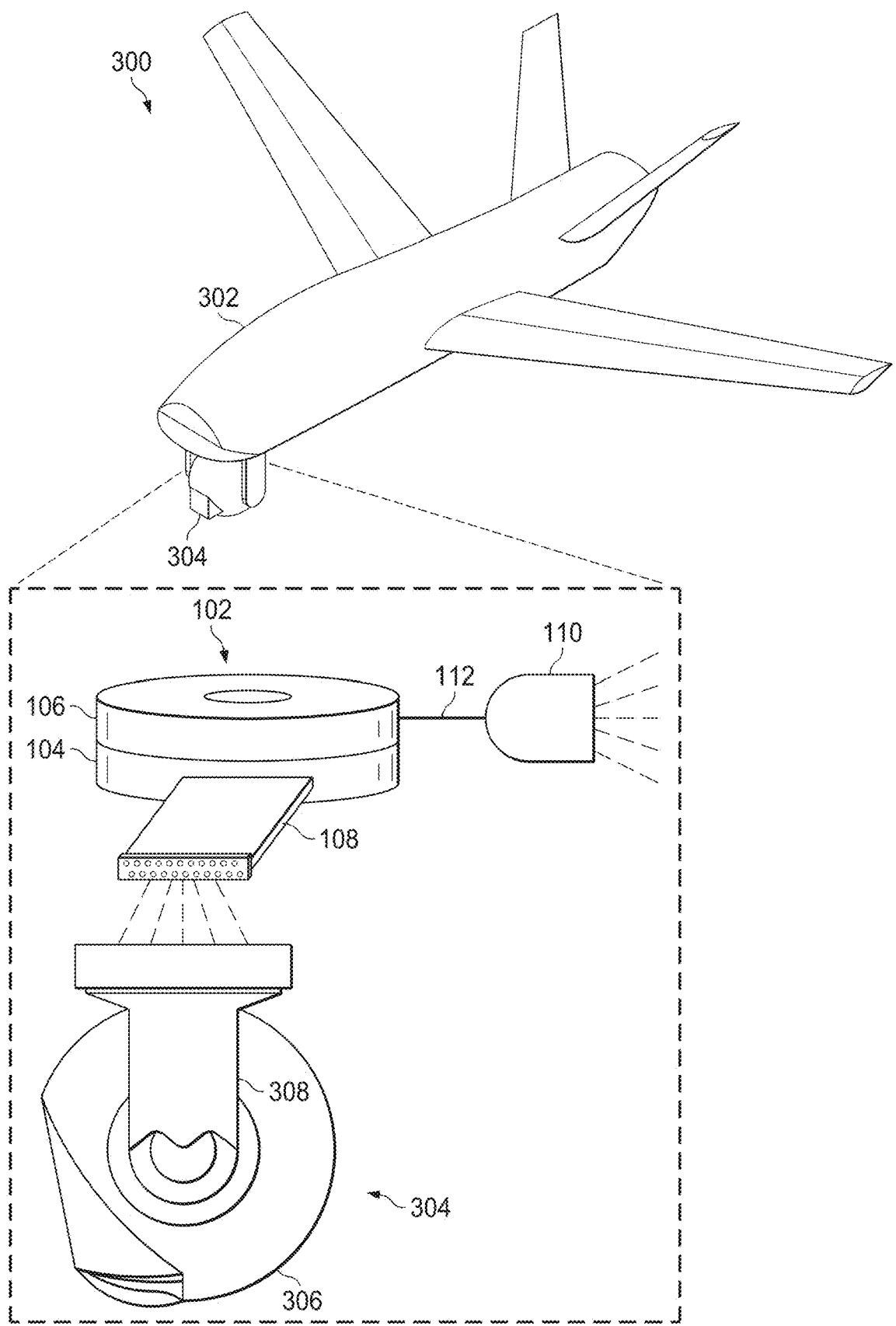
FIGS. 3 through 5 illustrate example applications supporting high-speed communication through a slip ring using modulation and multipath signaling in accordance with this disclosure.
Figure 4:
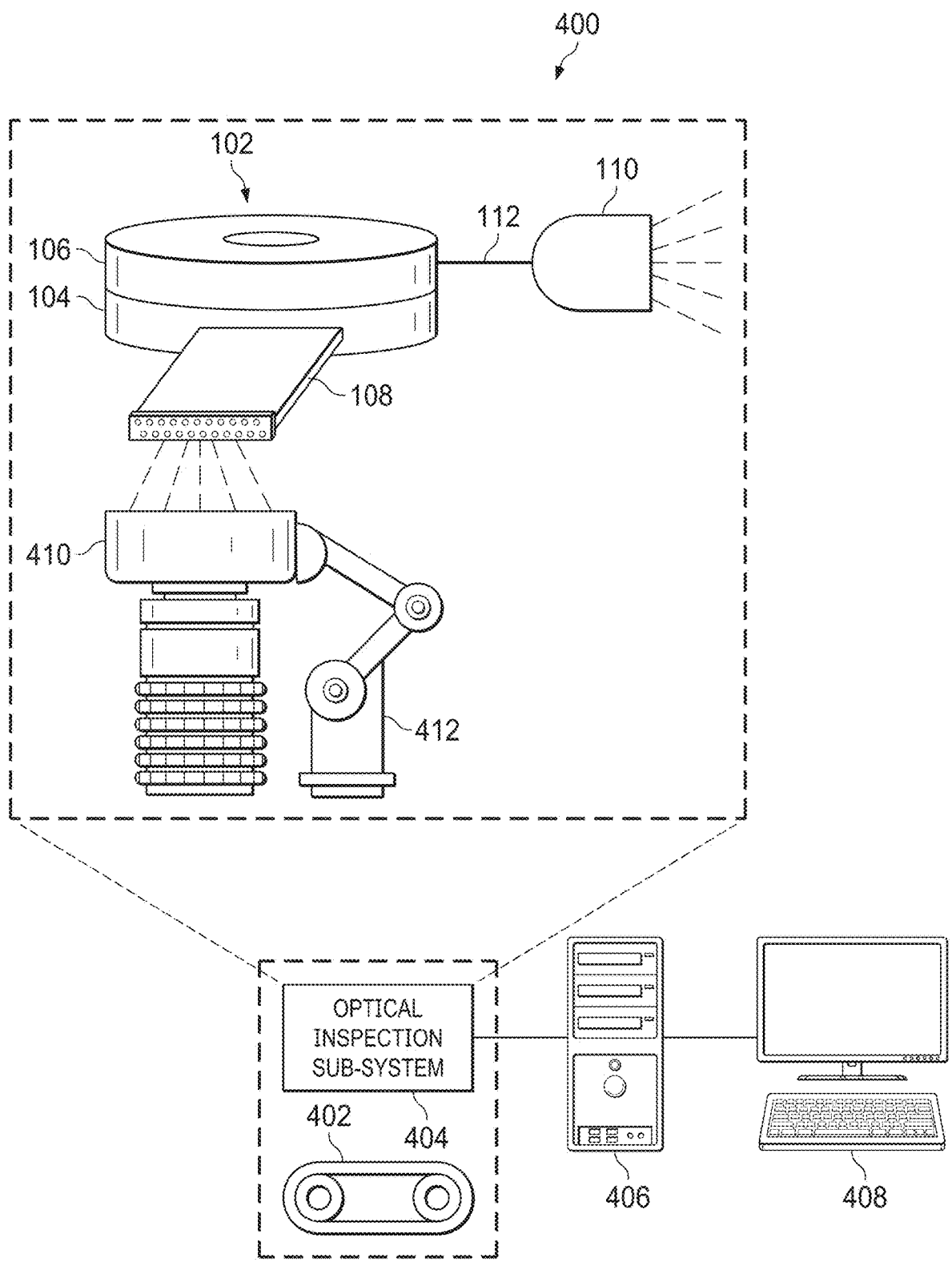
Figure 5:
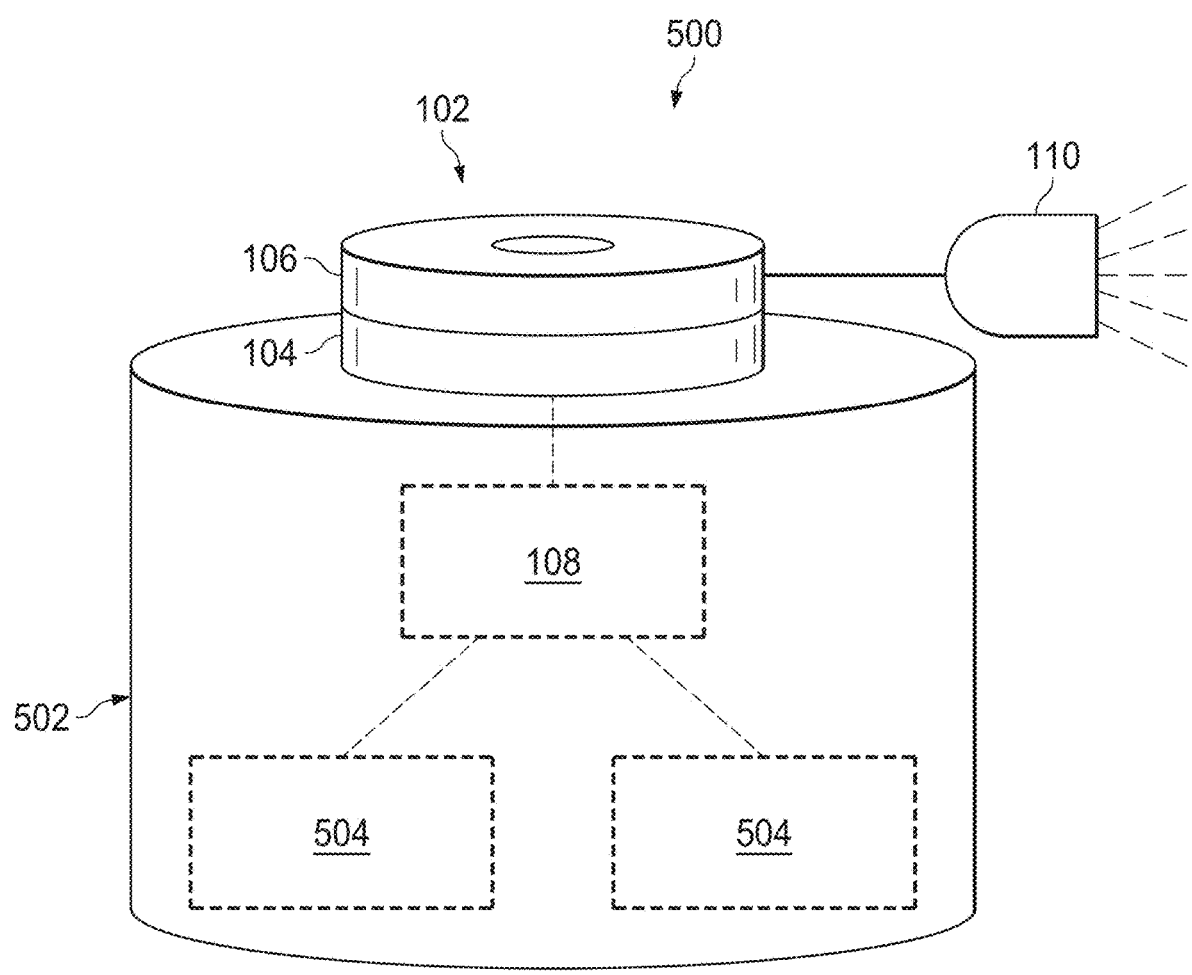

FIGS. 3 through 5 illustrate example applications supporting high-speed communication through a slip ring using modulation and multipath signaling in accordance with this disclosure. For ease of explanation, the applications shown in FIGS. 3 through 5 are described as involving the use of the slip ring 102 and other components of FIG. 1. However, the system 100 shown in FIG. 1 may be used in any other suitable application, and the design of the system 100 can vary as taught or suggested by this disclosure.

As shown in FIG. 3, a vehicle 300 includes a body 302 and an electronics assembly 304 mounted on the body 302. In this particular example, the vehicle 300 represents a flight vehicle, such as plane, drone, or other vehicle that can travel in the air or in space. Thus, in this example, the body 302 includes features such as wings and fins. However, any other suitable land, airborne, space, or underwater vehicle may have a suitable body 302 and include one or more instances of the electronics assembly 304 mounted on the body 302.

The electronics assembly 304 in this example includes one or more electronic components 306 mounted on a rotatable gimbal 308. The one or more electronic components 306 can include any suitable device or devices that perform one or more desired functions, such as one or more cameras, sensors, or other devices. The gimbal 308 represents a structure configured to rotate the one or more electronic components 306. Depending on the implementation, the gimbal 308 can rotate the one or more electronic components 306 about a single axis (such as a horizontal or vertical axis through the gimbal 308) or about multiple axes (such as horizontal and vertical axes through the gimbal 308).

In the example shown in FIG. 3, the first portion 104 of the slip ring 102 may be physically coupled to the gimbal 308, and the first interface 108 may be electrically coupled to the one or more electronic components 306. Also, the second portion 106 of the slip ring 102 may be physically coupled to the body 302 of the vehicle 300, and the second interface 110 may be electrically coupled to one or more internal components of the vehicle 300. This may allow, for example, an on-board computer, control system, or other internal component of the vehicle 300 to provide data to or receive data from the one or more electronic components 306 through the slip ring 102. This may also allow on on-board power supply system to provide electrical power to the one or more electronic components 306 through the slip ring 102. In these embodiments, the transceiver 114 and the signal splitter/combiner 120 may be incorporated into the electronics assembly 304, although this is not necessarily required.

As shown in FIG. 4, a system 400 can be used to capture data associated with a manufacturing system, processing system, or other system in which automation or automated collection of information is used. In this example, the system 400 represents an inspection system used to optically inspect parts or components. In this specific example, the parts or components can be transported via a conveyor belt 402 or other transport mechanism, and an optical inspection sub-system 404 can be used to capture one or more images of the parts or components. The images from the optical inspection sub-system 404 can be provided to a computer 406 or other processing system for analysis. The images, analysis results, or other information can be displayed to one or more users via at least one display 408.

In FIG. 4, the optical inspection sub-system 404 includes at least one image sensor 410, such as a camera or other image capture device. The image sensor 410 can be mounted to a robotic arm 412 or other structure that can maneuver the image sensor 410 to different locations for capturing images. The robotic arm 412 or other structure can also rotate the image sensor 410 as needed (about one axis or about multiple axes) to properly orient the image sensor 410 for image capture.

In the example shown in FIG. 4, the first portion 104 of the slip ring 102 may be physically coupled to the image sensor 410, and the first interface 108 may be electrically coupled to the image sensor 410. Also, the second portion 106 of the slip ring 102 may be physically coupled to the robotic arm 412, and the second interface 110 may be electrically coupled to one or more internal components of the robotic arm 412, to the computer 406 or other processing system, or to any other suitable components. This may allow, for example, the computer 406 to provide capture commands to the image sensor 410 and the image sensor 410 to provide captured images to the computer 406 through the slip ring 102. This may also allow an external power supply to provide electrical power to the image sensor 410 through the slip ring 102. In these embodiments, the transceiver 114 and the signal splitter/combiner 120 may be incorporated into the image sensor 410 and the transceiver 116 and the signal splitter/combiner 122 may be incorporated into the computer 406 or robotic arm 412, although this is not necessarily required.

As shown in FIG. 5, a system 500 uses the slip ring 102 to facilitate the capture of sensor measurements or other information associated with a rotating object 502. The rotating object 502 here may represent any suitable component that rotates during use, possibly very quickly. The object 502 may, for example, represent a wheel or axle, a shaft or other part of a turbine or generator, a drill bit used in oil and gas drilling, or another object that rotates. One or more sensors 504 can be mounted on or otherwise used in conjunction with the rotating object 502. Each sensor 504 may be positioned on the outside of the rotating object 502 or within the rotating object 502.

In the example shown in FIG. 5, the first portion 104 of the slip ring 102 may be physically coupled to the rotating object 502, and the first interface 108 may be electrically coupled to the one or more sensors 504. Also, the second portion 106 of the slip ring 102 may be physically coupled to a support structure or other structure, and the second interface 110 may be electrically coupled to one or more external components (such as an external control, safety, or other system). This may allow, for example, the one or more external components to receive measurements from the sensors 504 through the slip ring 102. This may also allow an external power supply to provide electrical power to the sensors 504 through the slip ring 102. In the example shown in FIG. 5, the transceiver 114 and signal splitter/combiner 120 can be positioned within the rotating object 502.

Although FIGS. 3 through 5 illustrate examples of applications supporting high-speed communication through a slip ring 102 using modulation and multipath signaling, various changes may be made to FIGS. 3 through 5. For example, the applications shown here are merely three examples of the types of ways in which communications through a slip ring 102 may be used. This functionality may be used in any other suitable application having one or more slip rings.

Figure 6:
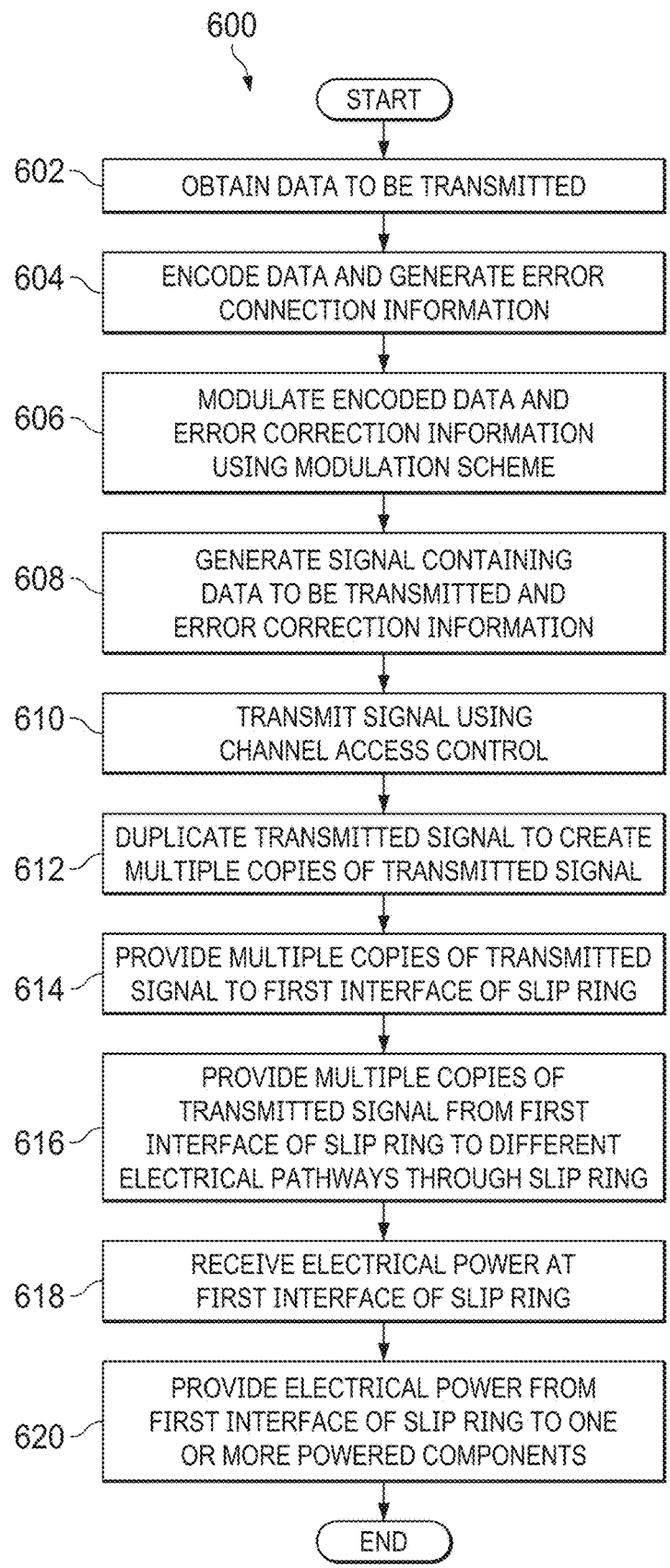
FIGS. 6 and 7 illustrate example methods for high-speed communication through a slip ring using modulation and multipath signaling in accordance with this disclosure.
Figure 7:
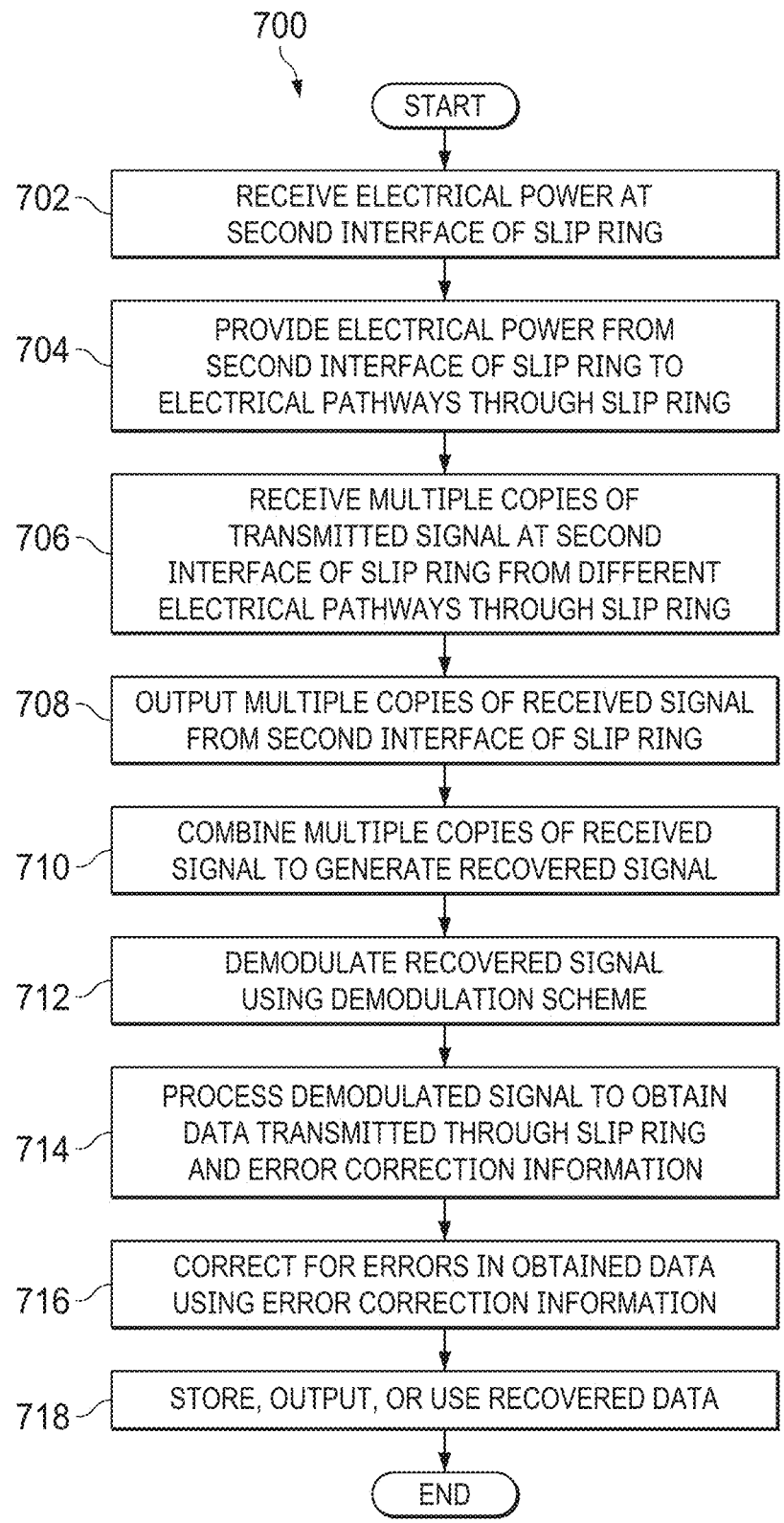

FIGS. 6 and 7 illustrate example methods 600 and 700 for high-speed communication through a slip ring using modulation and multipath signaling in accordance with this disclosure. In particular, FIG. 6 illustrates an example method 600 for transmitting data and receiving electrical power over a slip ring, and FIG. 7 illustrates an example method 700 for receiving data and transmitting electrical power over a slip ring. For ease of explanation, the methods 600 and 700 of FIGS. 6 and 7 are described as involving the use of the slip ring 102 of FIG. 2 in the system 100 of FIG. 1. However, the methods 600 and 700 of FIGS. 6 and 7 may involve the use of any other suitable slip rings designed in accordance with the teachings of this disclosure and any other suitable systems. Also, note that while data communication and power transfer in particular directions through a slip ring 102 may be described below, data communication and/or power transfer can occur in the opposite direction(s) through the slip ring 102.

As shown in FIG. 6, data to be transmitted is obtained at step 602. This may include, for example, the transceiver 114 receiving data to be transmitted through a slip ring 102 from one or more external components 126. As particular examples, this may include the one or more electronic components 306, the at least one image sensor 410, or the one or more sensors 504 providing data to be transmitted through the slip ring 102 to the transceiver 114.

The data is optionally encoded and error correction information is generated at step 604. This may include, for example, the transceiver 114 performing high-level encoding of the data to be transmitted, such as by reordering the data and performing an initial encoding of the data. This may also include the transceiver 114 generating LDPC FEC or other error correction information based on the encoded data. The encoded data and error correction information are modulated onto suitable carrier signals using a suitable modulation scheme at step 606, resulting in the generation of a signal containing the data to be transmitted and the error correction information at step 608. This may include, for example, the transceiver 114 performing OFDM or other modulation technique allowing signal recovery in the presence of signal distortions to modulate the encoded data and the error correction information onto multiple carrier frequencies to generate the signal 118. The signal is transmitted using a suitable channel access technique at step 610. This may include, for example, the transceiver 114 transmitting the signal 118 containing the modulated data and error correction information using TDMA, CDMA, or other suitable channel access technique.

The transmitted signal is split or otherwise duplicated to create multiple copies of the transmitted signal at step 612. This may include, for example, the signal splitter/combiner 120 splitting or otherwise duplicating the signal 118 to generate multiple copies 118a-118n of the signal 118. The multiple copies of the signal are provided to a first interface of a slip ring at step 614. This may include, for example, the signal splitter/combiner 120 providing the copies 118a-118n of the signal 118 to different pins or other inputs of the first interface 108. The multiple copies of the signal are provided from the first interface to multiple electrical pathways through the slip ring at step 616. This may include, for example, the first interface 108 providing the copies 118a-118n of the signal 118 to different electrically-conductive traces 204, which provide the copies 118a-118n of the signal 118 to different electrically-conductive brushes 208 (or vice versa) for communication through the slip ring 102.

Electrical power can be received at the first interface of the slip ring at step 618 and provided to one or more powered components at step 620. This may include, for example, the first interface 108 receiving electrical power sent over one or multiple electrical pathways through the slip ring 102. This may also include the first interface 108 providing the electrical power to one or more external components 126. As particular examples, this may include the first interface 108 providing the electrical power to at least one of the transceiver 114, the signal splitter/combiner 120, the one or more electronic components 306, the at least one image sensor 410, or the one or more sensors 504.

As shown in FIG. 7, electrical power can be received at a second interface of the slip ring at step 702 and provided to one or more electrical pathways through the slip ring at step 704. This may include, for example, the second interface 110 receiving electrical power from one or more power supplies representing or included within one or more of the external components 128. This may also include the second interface 110 providing the electrical power to one or multiple electrical pathways through the slip ring 102.

Multiple copies of a transmitted signal are received at the second interface of the slip ring through multiple electrical pathways of the slip ring at step 706 and are output at step 708. This may include, for example, different pins or other outputs of the second interface 110 receiving the copies 118a'-118n' of the signal 118 through the slip ring 102. This may also include the second interface 110 of the slip ring 102 providing the copies 118a'-118n' of the signal 118 to the signal splitter/combiner 122. The multiple copies of the signal are combined to produce a recovered signal at step 710. This may include, for example, the signal splitter/combiner 122 combining the copies 118a'-118n' of the signal 118 to generate a recovered modulated data signal 124.

The recovered signal is demodulated using a suitable demodulation scheme at step 712. This may include, for example, the transceiver 116 performing OFDM or other demodulation technique allowing signal recovery in the presence of distortions to demodulate the encoded data and the error correction information from multiple carrier frequencies. The transceiver 116 here can support a suitable channel access technique, such as TDMA or CDMA, to receive the signal 124. The demodulated signal is processed to obtain data being transmitted through the slip ring and the error correction information at step 714, and any errors in the data are corrected using the error correction information at step 716. This may include, for example, the transceiver 116 optionally performing high-level decoding of the data, such as by reordering the data and performing a decoding of the data (thereby reversing the corresponding operations performed by the transceiver 114). This may also include the transceiver 116 using the LDPC FEC or other error correction information to correct errors in the recovered data.

The data can be stored, output, or used in some manner at step 718. This can include, for example, the transceiver 116 providing the recovered data to one or more external components 128. As particular examples, this can include, the transceiver 116 providing the recovered data to one or more components within the vehicle 300, the computer 406 or other processing system, or to an external control, safety, or other system. Note that the recovered data can be stored, output, or used in any other suitable manner and for any suitable purpose, depending on the application.

Although FIGS. 6 and 7 illustrate examples of methods 600 and 700 for high-speed communication through a slip ring using modulation and multipath signaling, various changes may be made to FIGS. 6 and 7. For example, the transfer of power through the slip ring 102 is optional and need not occur in certain applications. Also, while data communication and power transfer are shown here as occurring in opposite directions, this need not be the case. For instance, data and power can be transferred the same direction, and (optionally) data can also flow in the opposite direction to provide for bi-directional data transfer. In addition, while shown as a series of steps, the steps in each figure can overlap, occur in parallel, occur in a different order, or occur any number of times. As specific examples, steps 602-616 and steps 618-620 may overlap with each other, and steps 702-704 and steps 706-718 may overlap with each other.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
   a transmitter configured to generate a signal carrying data;
   a signal splitter configured to generate multiple copies of the signal;
   a slip ring comprising:
      a first portion and a second portion, one portion of the slip ring configured to rotate relative to the other portion of the slip ring;
      a first interface associated with the first portion of the slip ring and configured to receive the multiple copies of the signal;
      a second interface associated with the second portion of the slip ring; and
      multiple electrical pathways electrically coupling the first and second interfaces, at least some of the electrical pathways configured to transport the multiple copies of the signal from the first interface to the second interface;
   a signal combiner configured to receive the multiple copies of the signal from the second interface and to generate a recovered signal using the multiple copies of the signal; and
   a receiver configured to recover the data from the recovered signal.

2. The system of claim 1, wherein:
   the transmitter is configured to modulate the data in order to generate the signal; and
   the receiver is configured to demodulate the recovered signal in order to recover the data.

3. The system of claim 2, wherein the transmitter and the receiver are configured to respectively use modulation and demodulation to combat multipath interference caused by communication of the multiple copies of the signal through two or more of the electrical pathways of the slip ring.

4. The system of claim 2, wherein the transmitter and the receiver are configured to use a common channel access technique to communicate through the slip ring.

5. The system of claim 4, wherein:
   the transmitter and the receiver are configured to use Orthogonal Frequency Division Multiplexing (OFDM) for modulation and demodulation; and
   the transmitter and the receiver are configured to use Time Division Multiple Access (TDMA) for channel access.

6. The system of claim 1, wherein:
   the transmitter is further configured to generate error correction information and to transmit the error correction information in the signal; and
   the receiver is further configured to recover and use the error correction information.

7. The system of claim 6, wherein the error correction information comprises low-density parity-check (LDPC) forward error correction (FEC) information.

8. The system of claim 1, wherein the electrical pathways that transport the multiple copies of the signal from the first interface to the second interface are at least one of:
   spatially distributed within the slip ring; and
   configured to transport electrical power through the slip ring.

9. The system of claim 1, wherein:
   the transmitter forms part of a first transceiver;
   the receiver forms part of a second transceiver; and
   the transceivers are configured to engage in bi-directional communication through the slip ring.

10. The system of claim 1, wherein the transmitter and the receiver are configured to communicate through the slip ring at a rate of at least 1 Gbps.

11. An apparatus comprising:
    a transmitter configured to generate a signal carrying data;
    a signal splitter configured to generate multiple copies of the signal; and
    a slip ring comprising:
       a first portion and a second portion, one portion of the slip ring configured to rotate relative to the other portion of the slip ring;
       a first interface associated with the first portion of the slip ring and configured to receive the multiple copies of the signal;
       a second interface associated with the second portion of the slip ring; and
       multiple electrical pathways electrically coupling the first and second interfaces, at least some of the electrical pathways configured to transport the multiple copies of the signal from the first interface to the second interface.

12. The apparatus of claim 11, wherein the transmitter is configured to:
    modulate the data in order to generate the signal; and
    use a channel access technique to communicate through the slip ring.

13. The apparatus of claim 12, wherein the transmitter is further configured to generate error correction information and to transmit the error correction information in the signal.

14. The apparatus of claim 13, wherein:
    the transmitter is configured to use Orthogonal Frequency Division Multiplexing (OFDM) for modulation;
    the transmitter is configured to use Time Division Multiple Access (TDMA) for channel access; and
    the error correction information comprises low-density parity-check (LDPC) forward error correction (FEC) information.

15. The apparatus of claim 11, wherein the electrical pathways that transport the multiple copies of the signal from the first interface to the second interface are at least one of:
    spatially distributed within the slip ring; and
    configured to transport electrical power through the slip ring.

16. An apparatus comprising:
a slip ring comprising:
- a first portion and a second portion, one portion of the slip ring configured to rotate relative to the other portion of the slip ring;
- a first interface associated with the first portion of the slip ring and configured to receive multiple copies of a signal carrying data;
- a second interface associated with the second portion of the slip ring; and
- multiple electrical pathways electrically coupling the first and second interfaces, at least some of the electrical pathways configured to transport the multiple copies of the signal from the first interface to the second interface;

a signal combiner configured to receive the multiple copies of the signal from the second interface and to generate a recovered signal using the multiple copies of the signal; and a receiver configured to recover the data from the recovered signal.

17. The apparatus of claim 16, wherein the receiver is configured to:
- use a channel access technique to communicate through the slip ring; and
- demodulate the recovered signal in order to recover the data.

18. The apparatus of claim 17, wherein the receiver is further configured to recover and use error correction information from the signal.

19. The apparatus of claim 18, wherein:
- the receiver is configured to use Orthogonal Frequency Division Multiplexing (OFDM) for demodulation;
- the receiver is configured to use Time Division Multiple Access (TDMA) for channel access; and
- the error correction information comprises low-density parity-check (LDPC) forward error correction (FEC) information.

20. The apparatus of claim 16, wherein the electrical pathways that transport the multiple copies of the signal from the first interface to the second interface are at least one of:
- spatially distributed within the slip ring; and
- configured to transport electrical power through the slip ring.

* * * * *